US012687597B2

(12) United States Patent (10) Patent No.: US 12,687,597 B2
Bollenbeck et al. (45) Date of Patent: Jul. 21, 2026

(54) MAGNETIC RESONANCE SYSTEM WITH INTEGRATED PILOT TONE APPARATUS AND METHOD FOR THE OPERATION THEREOF

(71) Applicant: Siemens Healthineers AG, Forchheim (DE)

(72) Inventors: Jan Bollenbeck, Eggolsheim (DE); Peter Speier, Erlangen (DE); Qiu Yi Zhang, Shenzhen (CN)

(73) Assignee: Siemens Healthineers AG, Forchheim (DE)

( * ) Notice: Subject to any disclaimer, the term of this patent is extended or adjusted under 35 U.S.C. 154(b) by 212 days.

(21) Appl. No.: 18/752,153

(22) Filed: Jun. 24, 2024

(65) Prior Publication Data

US 2025/0004077 A1 Jan. 2, 2025

(30) Foreign Application Priority Data

Jun. 28, 2023 (EP) ..................................... 23182021

(51) Int. Cl.
*G01R 33/36* (2006.01)
(52) U.S. Cl.
CPC ................................. *G01R 33/3621* (2013.01)

(58) Field of Classification Search
CPC .......... G01R 33/3621; G01R 33/56509; G01R 33/5673; G01R 33/44; G01R 33/48; A61B 5/055
See application file for complete search history.

(56) References Cited

U.S. PATENT DOCUMENTS

| | | | |
|---|---|---|---|
| 10,222,443 B2 | 3/2019 | Bollenbeck et al. | |
| 2003/0078004 A1 | 4/2003 | Vester | |
| 2014/0062480 A1 | 3/2014 | Bollenbeck et al. | |
| 2015/0207653 A1 | 7/2015 | Oppelt | |
| 2015/0320342 A1 | 11/2015 | Biber | |
| 2017/0160367 A1* | 6/2017 | Schröter | .......... G01R 33/56509 |
| 2018/0353140 A1 | 12/2018 | Speier | |

FOREIGN PATENT DOCUMENTS

| | | |
|---|---|---|
| DE | 10148462 C1 | 6/2003 |
| DE | 102012215726 A1 | 3/2014 |

* cited by examiner

*Primary Examiner* — G. M. A Hyder
(74) *Attorney, Agent, or Firm* — Lempia Summerfield Katz LLC

(57) ABSTRACT

A magnetic resonance system has a receiver designed to receive and evaluate a pilot tone signal and a magnetic resonance signal at the same time. The receiver additionally has a frequency-dependent attenuator to attenuate a received pilot tone signal relative to a received magnetic resonance signal.

16 Claims, 2 Drawing Sheets

MAGNETIC RESONANCE SYSTEM WITH INTEGRATED PILOT TONE APPARATUS AND METHOD FOR THE OPERATION THEREOF

RELATED APPLICATION

This application claims the benefit of EP 23182021.8, filed on Jun. 28, 2023, which is hereby incorporated by reference in its entirety.

FIELD

Independent of the grammatical term usage, individuals with male, female, or other gender identities are included within the term.

The present disclosure relates to a magnetic resonance system with a pilot tone apparatus. The magnetic resonance system has a receiver which is designed to receive and evaluate a pilot tone signal and a magnetic resonance signal at the same time.

BACKGROUND

Magnetic resonance tomography systems are imaging apparatuses which, for the purpose of depicting an examination object, align nuclear spins of the examination object by a strong external magnetic field and excite said nuclear spins into precession about this alignment by a magnetic alternating field. The precession or return of the spins from this excited state into a state having lower energy then generates in response a magnetic alternating field which is received via antennas.

Magnetic gradient fields are used to impress a spatial encoding onto the signals, said spatial encoding subsequently allowing an assignment of the received signal to a volume element. The received magnetic resonance signal is then evaluated, and a two-dimensional or three-dimensional imaging representation of the examination object is provided.

The magnetic resonance signals are very weak. In order to obtain a sufficiently high signal-to-noise ratio, the signal must therefore be captured over an extended time period in a single measurement or in repeated measurements. The capture of the magnetic resonance signals in this case is slow in comparison with unavoidable movements of the patient such as heartbeat or respiratory movement. The movements in this case cause artifacts in the images that are generated.

It is nonetheless possible to depict the moving organs if a brief image capture, this being synchronized with the movement, is executed repeatedly and averaged over the captured data.

A synchronization can be achieved using dedicated sensors, such as a respiratory belt or ECG electrodes, for example.

In order to avoid these additional sensors, it is also already disclosed in the publication US 2015/0320342 A1 to couple a continuous monofrequency magnetic alternating field originating from a small conductor loop at least partially through the body of the patient into the individual elements of a magnetic resonance local coil.

Since most biological tissues are almost completely transparent to magnetic fields, the generated magnetic field penetrates the body of the patient almost unchanged. Most tissues are however (slightly) conductive and therefore the continuous wave magnetic field induces eddy currents. These eddy currents in turn generate a magnetic field which is superimposed on the excitation field, resulting in modulations in the received magnetic field in the receiving coil.

By evaluating this signal, a movement phase of the heart or respiration can be inferred.

When using a pilot tone signal, it may however be the case that the received signals and therefore the amplitude variations caused by the movement are very weak and difficult to evaluate. This occurs in particular if the pilot tone signal and the magnetic resonance signal are received and evaluated at the same time by the same receiver, since the effective amplitude dynamic range of the receiver system must not be restricted by the pilot tone signal and therefore the maximum possible receive level of the pilot tone signal is limited. It may also be the case that the portion of the magnetic alternating field which penetrates the tissue moved by the heartbeat is too small, and the demodulated receive signal has a signal-to-noise ratio which is again too low in this case.

SUMMARY AND DETAILED DESCRIPTION

An object is therefore to improve and to render more reliable the capture of movements of the patient.

The object is achieved by magnetic resonance system as claimed.

The magnetic resonance system has a pilot tone apparatus (transceiver, receiver, and/or transmitter). The pilot tone apparatus decouples a high-frequency magnetic alternating field which is also referred to as a pilot tone in the following. The alternating field interacts with a body of a patient by induced currents and susceptibility jumps at organ boundaries. This interaction varies with movements of the body and causes the pilot tone to be modulated into a pilot tone signal, which a receiver of the pilot tone apparatus picks up and thus can capture a movement of the body of the patient.

The magnetic resonance system has a magnetic resonance tomography unit for receiving a magnetic resonance signal for the purpose of depicting a patient. In the magnetic resonance system, a receiver of the magnetic resonance tomography unit is used to additionally receive the pilot tone signal at the same time as the magnetic resonance signal. Dual use is therefore made of available signal processing resources. In this case, the pilot tone apparatus must be designed to generate a pilot tone in a range which is also captured by the receiver. In other words, the frequency range of the pilot tone is close to the Larmor frequency which is predetermined by the nuclear spin that is to be captured and a static magnetic field B0 of the magnetic resonance tomography unit. The pilot tone has a frequency which deviates slightly from the Larmor frequency, for example by less than 5%, 2% or 1%, and does not lie in the frequency band occupied by the MR signal.

Provision is advantageously made for further resources to be used jointly for the pilot tone signal and magnetic resonance signal. In particular, it is conceivable for the magnetic resonance system to have a shared receive path for the pilot tone signal and the magnetic resonance signal, and a shared signal path or receive path to the receiver, including antenna coils and/or preamplifiers or low-noise amplifiers (LNA).

The magnetic resonance system also has a frequency-dependent attenuator which is designed to attenuate a received pilot tone signal relative to a received magnetic resonance signal. In other words, the frequency-dependent attenuator has a frequency-dependent characteristic which produces little or no attenuation for the magnetic resonance signal and a predetermined stronger attenuation for the pilot tone signal. The ratio of the attenuation for the magnetic resonance signal to the pilot tone signal assumes a predetermined value in this case.

The attenuator in this case is arranged in the signal path upstream of an A/D converter of the receiver, in particular between the preamplifier and the A/D converter, and is preferably realized as an analog circuit. It is also conceivable for the attenuator to be an integral part of the preamplifier, for example as a frequency-dependent negative feedback.

A distinction is made here between the terms pilot tone and pilot tone signal. Pilot tone signifies the signal that is generated by the pilot tone apparatus (transceiver or transmitter) and is beamed into the body of the patient. By contrast, pilot tone signal signifies a signal which results from the pilot tone and is evaluated in the receiver. The pilot tone signal has a desired variation, movements of or in the body of the patient causing an amplitude variation or modulation of the propagated pilot tone that is received by the local coil. In addition, the pilot tone signal can be subject to further pre-treatment, for example filtering by the frequency characteristic of the local coil or a band-pass filter, pre-amplification by an LNA, or frequency conversion to an intermediate frequency. However, these affect both the magnetic resonance signals that are picked up by the local coil and the modulated pilot tone in essentially the same way, such that for example frequency separation and amplitude ratio remain largely or completely unchanged. Remarks made in respect of the Larmor frequency of the magnetic resonance signal therefore relate to frequencies of an intermediate frequency signal that are correspondingly converted for the pilot tone signal if applicable.

In MR receiving systems today, the useful amplitude dynamic range is determined by the properties of the analog-digital converter (ADC). By inserting an attenuation upstream of the ADC, the available amplitude dynamic range of the receiving system can be increased at the expense of a slight increase of the noise figure. Since the noise figure of the receiver and therefore the background noise increase significantly less than the attenuation that is applied, the SNR of the received pilot tone signal can advantageously be increased if the level of the emitted pilot tone and hence the pilot tone signal is raised to the same extent as the receiver amplification is reduced by the attenuator. The useful amplitude dynamic range of the MR receive path remains unaffected by this.

Further advantageous embodiments are specified in the subclaims.

In a conceivable embodiment of the magnetic resonance system, the attenuation of the received pilot tone signal relative to the received magnetic resonance signal by the attenuator is greater than 3 dB, 6 dB or 9 dB. However, the attenuation is advantageously not greater than 12 dB, 18 dB or 24 dB.

In order to avoid interfering with the receipt of the magnetic resonance signal, the received pilot tone signal must have a significantly lower level, in particular at the input of a shared A/D converter. In order to increase a signal-to-noise ratio (SNR) of the pilot tone signal, a level of the emitted pilot tone is inventively raised by a comparable level in order to then reduce it again by the attenuator. It is thereby advantageously possible, despite the same level separation between magnetic resonance signal and pilot tone signal at the input of the A/D converter downstream of the attenuator to raise the SNR of the pilot tone signal by a value which corresponds approximately to the attenuation or the increase of the transmitted pilot tone. The value is restricted upwards by the limit of the pilot tone to be emitted and by the limited amplitude dynamic range of the preceding signal conditioning such as preamplifiers and/or mixers, SAR, regulatory limits and/or interference with other units by the pilot tone. It is however also possible in principle to arrange the attenuator upstream of the signal conditioning in the receive path, though a noise component (for example thermal noise) is then also amplified by the preamplifier.

In a possible embodiment of the magnetic resonance system, the magnetic resonance system is designed to compensate for an attenuation of the attenuator by a raised transmit level of the pilot tone apparatus for the pilot tone. If the attenuator reduces the pilot tone signal level by 6 dB, for example, the pilot tone level emitted by the pilot tone apparatus (transmitter or transmitter of a transceiver) is increased by a factor of 2 or 6 dB accordingly. A reference level here can be a pilot tone signal from a system according to the prior art, or a level of a maximum magnetic resonance signal that will be evaluated. In other words, by virtue of the attenuator and the raising of the level of the pilot tone, the level of the pilot tone signal at the input of the A/D converter is essentially unchanged in comparison with a magnetic resonance tomography unit from the prior art without the attenuator. In particular, the level separation between the magnetic resonance signal and the pilot tone signal downstream of the attenuator is kept to the same level as in a magnetic resonance system according to the prior art.

As described above, by virtue of the increased transmit level of the pilot tone, a better SNR is achieved for the received pilot tone signal.

In a conceivable embodiment of the magnetic resonance system, the attenuator has a notch filter (kerb filter). Notch filter signifies a filter which only reduces the level of a narrowband signal as it passes through, and essentially does not change other frequency ranges, i.e., has a ripple of less than 0.5 dB or 0.1 dB. Narrowband in this case is considered to be a signal which has a bandwidth similar to a bandwidth of the pilot tone signal, i.e., less than 500 Hz, 100 Hz, 50 Hz or 10 Hz. Dimensioning is also conceivable in which a plurality of pilot tone signals having spectral proximity are attenuated by a shared filter.

A notch filter advantageously attenuates only the pilot tone signal and leaves the magnetic resonance signal substantially unchanged.

In a possible embodiment of the magnetic resonance system, the attenuator has a quartz resonator.

Quartz resonators have an advantageous frequency stability.

In a conceivable embodiment of the magnetic resonance tomography unit, the attenuator has a plurality of coupled resonators. Resonators in this case signify filter elements, which have a resonant frequency, i.e., a preferred pass frequency or attenuation frequency. A coupling in this case is an interaction between the resonators which takes place in both directions between the resonators concerned. A coupling can take place inductively, capacitively, and/or resistively, for example.

It is advantageously possible by interacting resonators to influence the characteristic of an attenuator or band-pass filter, in particular the bandwidth of a pass range. The bandwidth and the attenuation can therefore be selected in such a way that a tolerable compromise is produced from an obtained attenuation of the PR signal frequency, a limited influence on the MR signal, and a transient time, which is as short as possible.

High-pass filters or low-pass filters can also be used as attenuators. In this case, the edge of the filter lies between the frequency of the pilot tone and the frequencies of the magnetic resonance signal, in particular the Larmor frequency of the magnetic resonance system, this being predetermined by the magnetic moment of the nuclear spin to be captured and the static magnetic field B0 of the magnetic resonance system. If the frequency of the pilot tone is higher than the Larmor frequency, a low-pass filter is used in order to attenuate the pilot tone signal, and correspondingly, if the pilot tone frequency is lower than the Larmor frequency, a high-pass filter is used. It is alternatively or additionally possible in this case to use a frequency selectivity of a resonant antenna coil in order to attenuate pilot tone signals which are spectrally further away.

However, a combination of a high-pass filter and a low-pass filter could also be used as an attenuator or a notch filter.

It is advantageously possible using high-pass and low-pass filters to achieve particularly rapid transient behavior and/or low ripple in the pass range.

In a possible embodiment of the magnetic resonance system, the magnetic resonance system has a plurality of receive channels. For example, the receive channels may be provided for parallel reception of magnetic resonance signals of a local coil matrix. The plurality of receive channels have in each case a receiver and frequency-dependent attenuator. The attenuator can be part of a receiver in this case but can also be part of a preamplifier or LNA, for example, or arranged between LNA and receiver. In this case, it is conceivable for the attenuators to have different attenuation values in each case. The attenuation value in this case is preferably dependent on an expected receive level of the pilot tone during live operation. In this case, the respective attenuation value is configured such that the pilot tone signal has substantially the same level in all receivers downstream of the attenuator.

For example, the receive level is influenced by a separation and a geometric arrangement of an attached antenna coil relative to a transmit antenna for the pilot tone.

It is also conceivable for the attenuator or attenuators to have an attenuation that can be adjusted by a controller of the magnetic resonance system, so that the attenuation can be adjusted by the controller in such a way that the pilot tone signal is reduced to a predetermined level at the receiver.

As a result of a geometric arrangement and different attenuation by the patient, the receive level of the pilot tone differs in different antenna coils and hence receive channels. In this case, the antenna coil having the highest level represents a limit for a maximum level of the emitted pilot tone. By virtue of individual attenuators in most or all receive channels, in particular if these have attenuation values that specifically reduce the level difference of the pilot tone signal between the receivers in comparison with the receive signals of the antenna coils, the pilot tone signal can be emitted with a higher level and thus the SNR of the pilot tone signal can be further increased.

In a conceivable embodiment of the magnetic resonance system, the magnetic resonance system has a controller designed to adjust an attenuation of the frequency-dependent attenuators. For example, an adjustable digital-analog converter can vary as a variable resistance, or via an output voltage can vary a variable capacitance in the form of a PIN diode in a circuit of an attenuator, as described below with reference to the figures.

In this case, the controller is designed to adjust the attenuators in such a way that a signal level difference between pilot tone signals is reduced in receivers of most of the receive channels. This can be effected for example by the controller executing a program in accordance with a method as explained below for operating the magnetic resonance system.

In the method, in one act the controller determines signal levels of the pilot tone signal in the plurality of receivers. For example, it is conceivable for digital receivers to filter out the pilot tone signal by a Fourier transformation and ascertain the level thereof. However, other filters such as band-pass filters, which separate the pilot tone signal, are also conceivable. It is however also possible, in the absence of a magnetic resonance signal and with an active pilot tone, to determine a level at the receiver as part of a calibration process, in which case essentially only the pilot tone signal is captured, and it is preferentially possible to dispense with costly filtering measures.

In a further act, the controller adjusts an attenuation of the frequency-dependent attenuators in such a way that a signal level difference between pilot tone signals is reduced in receivers of most of the receive channels. In other words, the levels of the pilot tone signals in the receive channels are equalized as a result of the adjustment of the attenuators.

In order to achieve this, it is conceivable for example to firstly identify a receive channel that has the lowest signal level for the pilot tone signal. For the other receive channels, the controller determines the level difference relative to this receive channel. The controller then adjusts the respective attenuators of the other receive channels in such a way that their signal level is reduced, preferably to substantially the signal level of the receive channel having the lowest signal level. If the signal level of a receive channel is for example 6 dB higher than the signal level of the weakest receive channel, the attenuation of the attenuator can be increased for example by 6 dB, but also by 7 dB or 8 dB or more.

In a further act, a transmit level of the pilot tone is adjusted in such a way that the signal level of the receive channels does not exceed a predetermined signal level upstream of the A/D converter. In this case, the predetermined signal level can be defined by an expected signal level for the magnetic resonance signal and/or input level at the A/D converter.

For example, if the expected signal level for the magnetic resonance signal is 0 dBFS, i.e., a maximum input level for processing by the A/D converter, and the signal level of the pilot tone signal of the receive channel having the lowest signal level is −18 dBFS, then for example the attenuators of the other receive channels are adjusted by the controller in such a way that their signal level does not exceed −18 dBFS. The signal level of the pilot tone can then be raised by 12 dB if a level separation of −6 dB is desired between the maximum expected magnetic resonance signals and the pilot tone signal.

The specified levels in the example are merely exemplary in this case and can also assume other values. It is also conceivable for example to identify the receive channel having the highest level for the pilot tone signal, to reduce the attenuation of the attenuators in the other receive channels correspondingly in order to obtain an essentially identical signal level for the pilot tone signal, and then to lower or raise the transmit level of the pilot tone.

It is advantageously possible by adaptively adjusting the attenuators and the pilot tone, in particular for a plurality of receive channels, to ensure that movements of or in the patient can be identified more reliably.

BRIEF DESCRIPTION OF THE DRAWINGS

The properties, features and advantages described above, and the manner in which these are achieved, become clearer

7

Figures 1, 2:
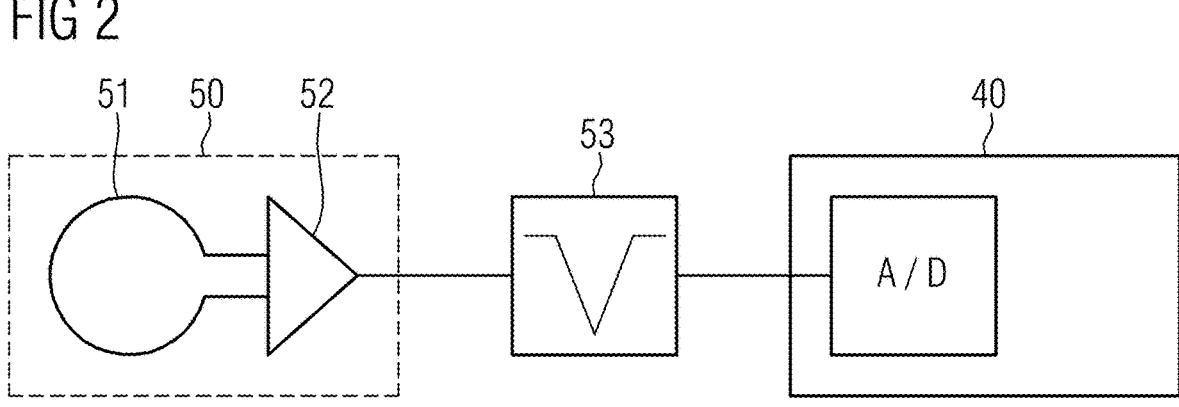
Figure 3:
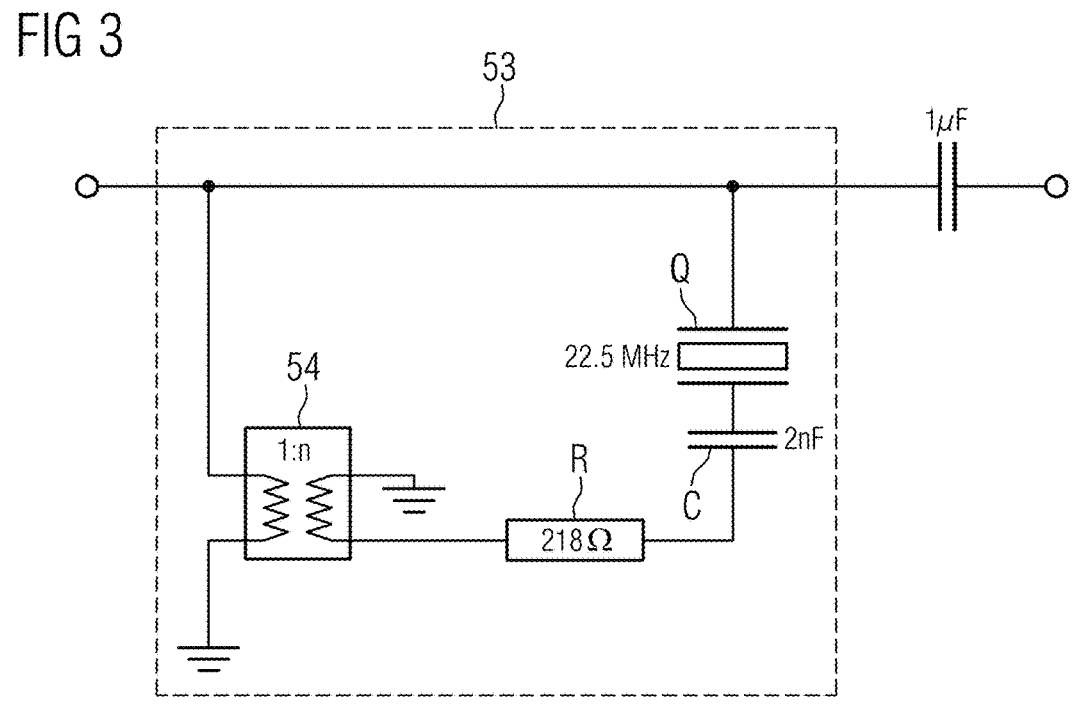
Figure 4:
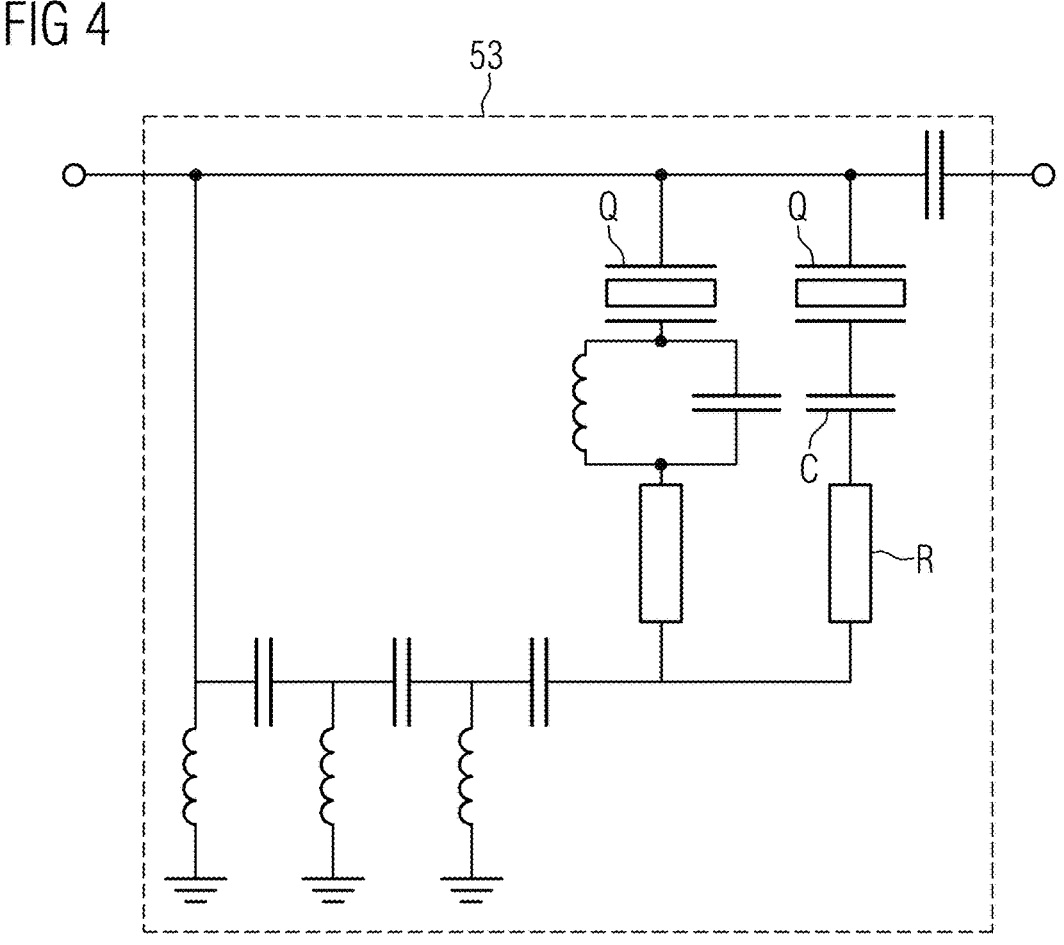

8 and more understandable in the context of the following description of the exemplary embodiments, these being explained in greater detail with reference to the drawings, in which:

FIG. 1 shows a schematic illustration of a magnetic resonance system according to an embodiment;

FIG. 2 shows an exemplary embodiment of a receive path of a magnetic resonance system;

FIG. 3 shows an exemplary embodiment of an attenuator for the magnetic resonance apparatus; and FIG. 4 shows an exemplary embodiment of an attenuator for the magnetic resonance apparatus.

DETAILED DESCRIPTION

FIG. 1 shows a schematic illustration of an embodiment of a magnetic resonance system 1.

The magnet unit 10 has a field magnet 11, which generates a static magnetic field B0 for aligning nuclear spins of specimens or the patient 100 in a recording region. The recording region is characterized by an extremely homogeneous static magnetic field B0, said homogeneity relating in particular to the magnetic field strength or the orientation and the amount. The recording region is almost spherical and is arranged in a patient tunnel 16, which extends in a longitudinal direction 2 through the magnet unit 10. A patient couch 30 can be moved in the patient tunnel 16 by the drive 36. The field magnet 11 is usually a superconductive magnet, which can provide magnetic fields having a magnetic flux density of up to 3T and even more in the latest devices. For lower field strengths, it is nonetheless also possible to use permanent magnets or electromagnets with normally conductive coils.

In addition, the magnet unit 10 has gradient coils 12 configured to superimpose variable magnetic fields on the magnetic field B0 in three spatial directions in order to achieve spatial differentiation of the imaging regions that are captured in the examination volume. The gradient coils 12 are usually coils composed of normally conductive wire, which can generate mutually orthogonal fields in the examination volume.

The magnet unit 10 also has a body coil 14, which is configured to beam a high-frequency signal supplied via a signal line into the examination volume, and to receive resonance signals emitted by the patient 100 and deliver said signals via a signal line.

A control unit (controller) 20 supplies the magnet unit 10 with the various signals for the gradient coils 12 and the body coil 14, and evaluates the received signals.

The control unit 20 therefore has a gradient drive circuit 21 configured to supply the gradient coils 12 with various currents via feed lines, said currents providing the desired gradient fields in the examination volume in a temporally coordinated manner.

The control unit 20 also has a high-frequency unit (transmitter) 22 configured to generate a high-frequency pulse having a predetermined time characteristic, amplitude and spectral power distribution, in order to excite a magnetic resonance of the nuclear spins in the patient 100. Pulse powers in the kilowatt range can be achieved in this case. The excitation pulses can be beamed into the patient 100 via the body coil 14 or also via a local transmit antenna.

The high-frequency unit 22 also has a receiver 40 for receiving and/or conditioning a magnetic resonance signal from the patient 100, said signal being picked up by the local coil 50 and transferred via a signal connection to the receiver 40. The receiver 40 is additionally designed to receive and evaluate a pilot tone.

The high-frequency unit 22 can also have a pilot tone transmitter 60, which transfers a pilot tone to a pilot tone transmit antenna, possibly also in the local coil 50, for decoupling via a signal connection. However, a separate pilot tone transmitter 60 which acts independently of the magnetic resonance system 1 is also conceivable.

A controller 23 communicates via a signal bus 25 with the gradient drive circuit 21 and the high-frequency unit 22.

A local coil 50 is arranged on the patient 100 and is connected via an interface cable 33 to the high-frequency unit 22 and receiver thereof.

In addition, the local coil 50 preferably has an antenna by which a pilot tone can be emitted or induced into the body of the patient 100.

FIG. 2 shows an exemplary embodiment of a receive path of a magnetic resonance system 1.

In the local coil 50, an antenna coil 51 picks up the pilot tone signal and magnetic resonance signals from the patient 100. The received signals are amplified by a low-noise amplifier LNA 52. Following thereupon, a notch filter 53 selectively attenuates the pilot tone signal in the receive path by a predetermined value. Details of the notch filter 53 are indicated in FIG. 3.

Other forms of the attenuator are however also conceivable. For example, a narrowband notch filter can also be realized by a quartz filter, which advantageously has a high degree of frequency stability.

The bandwidth of a notch filter 53 or a narrowband band-pass filter can also be influenced and adjusted, for example, by two coupled resonant filters, for example parallel or series resonance circuits. The attenuator can also conceivably be realized by a high-pass or low-pass filter, whose edge lies between the magnetic resonance signal and the pilot tone signal and adjusts the desired amplitude ratio by the attenuation. Noise components outside the frequency ranges of magnetic resonance signal and pilot tone signal can be suppressed by further filters in this case. For example, the antenna coil 51, which is usually tuned to the resonance of the magnetic resonance signal when receiving, already acts as a band-pass filter, which reduces such outside frequency components. Outside frequency components can also be suppressed by a further band-pass or complementary high-pass or low-pass filter.

The magnetic resonance signal and the pilot tone signal are then digitized and evaluated by an A/D converter in the receiver 40. The pilot tone signal and the magnetic resonance signal are preferably divided into different signal currents which are supplied to different processing processes. In particular, amplitude variations of the pilot tone signal are evaluated in this case in respect of characteristic changes for example for respiratory movement and heartbeat. Conversely, image data is derived from the magnetic resonance signals by image reconstruction. In this case, dependencies may nonetheless occur in the processes such that, for example, magnetic resonance signals are only processed further if for example no movements are detected in the pilot tone signal or predetermined movement phases are detected.

The distribution of the individual function groups in FIG. 2 is merely exemplary for an embodiment in this case. Other variants are also conceivable. For example, the attenuator 53 could also be an integral part of the local coil 50 or the receiver 40. It is also possible to change the sequence in the receive path or to combine functions, for example to integrate a filter function in the LNA.

FIG. 3 shows an exemplary embodiment of an attenuator for the magnetic resonance apparatus. This embodiment is based on a notch filter, which uses a quartz, here with an exemplary frequency of 22.5 MHz. The proposed attenuator has an input and output impedance of 50 Ohms, so that it can be incorporated in the high-frequency path in common receiver circuits.

A simple notch filter can be provided by a quartz, which is connected to a signal line and is connected in series with a capacitor C and a resistor R to a signal ground. A limiting condition in this case is the impedance of the signal line. The maximum attenuation can be selected via the value R of the series resistor in this case, the center frequency and the bandwidth of the notch filter being predetermined by the properties of the quartz and the values for C and R, allowing for the impedance of the signal line.

FIG. 3 illustrates increasing the bandwidth of a notch filter with quartz.

When resonance is present, the impedance of the quartz is largely determined by the internal dissipative resistance. By a transformer 54 having a winding ratio of 1:n, the resistance including the series connection of the resistor R and the quartz-internal dissipative resistance is reduced by a factor of $1/(1+n)2$ at the signal line. To this end, the primary side of the transformer and a series connection including quartz Q, capacitor C, and resistor R and the secondary side of the transformer 54 are arranged antiparallel between the signal line and a signal ground. The winding ratio of the windings on the primary side to the windings on the secondary side is 1:n in this case. Therefore, the resistance including the series connection of the resistor R and the quartz-internal dissipative resistance can be increased by the factor $(1+n)2$ by increasing the resistance value for R by this factor, the impedance at the signal line remaining unchanged overall. At the same time, the bandwidth of the attenuator is thereby increased by the factor $(1+n)2$ using the transformer 54. An additional degree of freedom in the design of the attenuator is advantageously gained thereby.

FIG. 4 shows a further exemplary embodiment of an attenuator. In contrast with FIG. 3, an additional widening of the bandwidth is obtained here by coupling together two resonant elements, two quartz resonators here, having different resonant frequencies. The coupling is realized by a parallel connection here, it being possible to influence the degree of coupling inter alia by the values for the resistors R. Since quartzes Q are usually available with certain standard frequencies, a different resonant frequency is achieved by connecting different reactive elements in series to the two quartzes. It is thus possible using two identical quartzes to nonetheless achieve different resonant frequencies for the two resonant elements.

In the case of magnetic resonance systems (1) having a plurality of receivers (40) for the pilot tone signal, provision is advantageously made for all these receivers (40) to have an attenuator. For example, this is the case when a local coil (50) has a matrix of antenna coils. As a result of receiving the pilot tone on multiple channels, the reliability of the pilot tone can be improved. The attenuation of the respective attenuators is preferably adjusted in such a way that in each case the pilot tone signal downstream of the attenuator has substantially the same level in the receivers (40), i.e., differs by less than 6 dB, 3 dB or 1 dB.

It is also conceivable for the attenuator or attenuators to be adjustable by the controller 23 with regard to attenuation. This can be achieved for example by replacing the capacitor C with a voltage-controlled PIN diode and/or replacing the resistor R with a voltage-controlled resistor, these being driven via a D/A converter. Provision can also be made for controlled changeover switches between attenuators having different attenuation values in a receive channel. In this way, the controller can adapt the pilot tone apparatus (transmitter, receiver, and/or transceiver) to different receiving conditions resulting from a different arrangement and/or patient. Possible procedures are explained in greater detail with reference to the method.

If not all receivers (40) are intended to be used for the evaluation of the pilot tone, it is also conceivable for receivers (40) without a pilot tone function to allow only the magnetic resonance signal to pass through a band-pass filter and to suppress the pilot tone signal.

Although the invention is illustrated and described in detail by the exemplary embodiment, the invention is not restricted to the examples disclosed herein and other variations may be derived therefrom by a person skilled in the art without departing from the scope of the invention.

The invention claimed is:

1. A magnetic resonance system comprising:
   a receiver of a pilot tone transceiver, the receiver configured to receive a pilot tone signal and a magnetic resonance signal at the same time; and
   a frequency-dependent attenuator configured to attenuate the received pilot tone signal relative to the received magnetic resonance signal.

2. The magnetic resonance system as claimed in claim 1, wherein the attenuator is configured to attenuate the pilot tone signal relative to the magnetic resonance signal by more than 3 dB.

3. The magnetic resonance system as claimed in claim 2, wherein the magnetic resonance system is configured to compensate for an attenuation of the attenuator by an increased transmit level of the pilot tone by the pilot tone transceiver.

4. The magnetic resonance system as claimed in claim 3, further comprising a preamplifier for the received pilot tone signal; and
   wherein the attenuator is arranged as part of the preamplifier or between the preamplifier and an analog-digital converter in the receiver.

5. The magnetic resonance system as claimed in claim 4, wherein the attenuator has a notch filter, a quartz resonator, or a plurality of coupled resonators.

6. The magnetic resonance system as claimed in claim 5, wherein the attenuator has a transformer whose primary side and secondary side are arranged antiparallel between a signal path and a signal ground, wherein a resonant element is arranged in series with the secondary side between the signal path and the signal ground.

7. The magnetic resonance system as claimed in claim 6, further comprising a plurality of receive channels, wherein the frequency-dependent attenuator and the receiver are in one of the receive channels and the other of the plurality of receive channels each have another frequency-dependent attenuator and receiver.

8. The magnetic resonance system as claimed in claim 1, further comprising a preamplifier for the received pilot tone signal; and
   wherein the attenuator is arranged as part of the preamplifier or between the preamplifier and an analog-digital converter in the receiver.

9. The magnetic resonance system as claimed in claim 1, wherein the attenuator has a notch filter.

10. The magnetic resonance system as claimed in claim 1, wherein the attenuator has a quartz resonator.

11. The magnetic resonance system as claimed in claim 1, wherein the attenuator has a plurality of coupled resonators.

12. The magnetic resonance system as claimed in claim 1, wherein the attenuator has a transformer whose primary side and secondary side are arranged antiparallel between a signal path and a signal ground, wherein a resonant element is arranged in series with the secondary side between the signal path and the signal ground.

13. The magnetic resonance system as claimed in claim 1, further comprising a plurality of receive channels, wherein the frequency-dependent attenuator and the receiver are in one of the receive channels and the other of the plurality of receive channels each have another frequency-dependent attenuator and another receiver.

14. The magnetic resonance system as claimed in claim 13, wherein an attenuation of the frequency-dependent attenuators is adjustable, and further comprising a controller configured to adjust an attenuation of the frequency-dependent attenuators in such a way that a signal level difference between pilot tone signals is reduced in receivers of most of the receive channels.

15. The magnetic resonance system of claim 1 wherein the attenuator is configured to attenuate the pilot tone signal relative to the magnetic resonance signal by more than 6 dB.

16. A method for operating a magnetic resonance system, the method comprising:

determining signal levels of a pilot tone signal in a plurality of receivers;

adjusting an attenuation of frequency-dependent attenuators by a controller in such a way that a signal level difference between pilot tone signals of the receivers is reduced in most of the receivers; and adjusting a signal level of a pilot tone.

* * * * *